US011444582B2

(12) United States Patent
Honda et al.

(10) Patent No.: US 11,444,582 B2
(45) Date of Patent: Sep. 13, 2022

(54) POWER AMPLIFIER CIRCUIT

(71) Applicant: Murata Manufacturing Co., Ltd., Kyoto (JP)

(72) Inventors: Yuri Honda, Kyoto (JP); Kenji Mukai, Kyoto (JP); Fumio Harima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 47 days.

(21) Appl. No.: 17/159,953

(22) Filed: Jan. 27, 2021

(65) Prior Publication Data

US 2021/0152132 A1 May 20, 2021

Related U.S. Application Data

(63) Continuation of application No. 16/521,006, filed on Jul. 24, 2019, now Pat. No. 10,924,067.

(30) Foreign Application Priority Data

Aug. 10, 2018 (JP) .............................. JP2018-150968

(51) Int. Cl.
| | |
|---|---|
| *H03F 3/04* | (2006.01) |
| *H03F 1/32* | (2006.01) |
| *H03F 3/21* | (2006.01) |
| *H03F 1/56* | (2006.01) |

(52) U.S. Cl.
CPC ............. *H03F 1/3205* (2013.01); *H03F 1/32* (2013.01); *H03F 1/56* (2013.01); *H03F 3/21* (2013.01); *H03F 2200/222* (2013.01); *H03F 2200/451* (2013.01)

(58) Field of Classification Search
CPC ....................................................... H03F 3/04
See application file for complete search history.

(56) References Cited

U.S. PATENT DOCUMENTS

| | | | |
|---|---|---|---|
| 2004/0075504 A1* | 4/2004 | Vintola | ..................... H03F 1/52 330/298 |
| 2014/0375390 A1 | 12/2014 | Schooley et al. | |
| 2015/0148095 A1 | 5/2015 | Shi et al. | |
| 2016/0079927 A1 | 3/2016 | Kamitani et al. | |
| 2016/0134242 A1* | 5/2016 | Watanabe | ................. H03F 3/21 330/296 |

(Continued)

FOREIGN PATENT DOCUMENTS

JP          2003-324325 A       11/2003

*Primary Examiner* — Patricia T Nguyen
(74) *Attorney, Agent, or Firm* — Pearne & Gordon LLP

(57) ABSTRACT

A power amplifier circuit includes an amplifier transistor, a bias circuit that supplies a bias current or voltage to the amplifier transistor, and a resistance element connected between a base of the amplifier transistor and the bias circuit. The bias circuit includes a voltage generation circuit, a first transistor having a base to which a first direct-current voltage is supplied and an emitter from which the bias current or voltage is supplied, a second transistor having a base to which a second direct-current voltage is supplied and an emitter connected to the emitter of the first transistor, a signal supply circuit that supplies an input signal to the base of the second transistor, and an impedance circuit disposed between the base of the first transistor and the base of the second transistor.

18 Claims, 9 Drawing Sheets

(56) References Cited

U.S. PATENT DOCUMENTS

| | | | |
|---|---|---|---|
| 2018/0342992 A1* | 11/2018 | Sato | H03F 3/195 |
| 2018/0358933 A1 | 12/2018 | Matsui et al. | |
| 2019/0326865 A1 | 10/2019 | Okabe et al. | |
| 2020/0186093 A1 | 6/2020 | Seong et al. | |
| 2021/0126600 A1* | 4/2021 | Sukemori | H03F 1/0266 |

* cited by examiner

POWER AMPLIFIER CIRCUIT

CROSS REFERENCE TO RELATED APPLICATIONS

This is a continuation of U.S. patent application Ser. No. 16/521,006 filed on Jul. 24, 2019, which claims priority from Japanese Patent Application No. 2018-150968 filed on Aug. 10, 2018. The contents of these applications are incorporated herein by reference in their entireties.

BACKGROUND

The present disclosure relates to a power amplifier circuit. In a power amplifier circuit that is mounted in a mobile communication device such as a mobile phone, a bipolar transistor is typically used as an amplifier. The bipolar transistor has a thermal positive feedback characteristic in which if the temperature of the element increases, the collector current increases, which further raises the temperature of the element, leading to a further increase in the collector current. To suppress the increase in the collector current caused by the temperature increase, a configuration is known in which, for example, a resistance element (hereinafter also referred to as a ballast resistor) is disposed between the base of the bipolar transistor and a base bias voltage supply terminal. In this configuration, a voltage drop across the ballast resistor suppresses the increase in the base current, and, as a result, the increase in the collector current is also suppressed.

In a configuration including a ballast resistor, if the base current increases with an increase in the power level of an input signal, a voltage drop across the ballast resistor increases, which results in a decrease in the base voltage. Thus, the amplitude of the collector current is not proportionate to the amplitude of the base current, and the power gain decreases, which may deteriorate the linearity of the amplifier. To prevent the deterioration of the linearity, for example, Japanese Unexamined Patent Application Publication No. 2003-324325 discloses a power amplifier that includes a capacitance element between a signal input terminal and a base bias voltage supply terminal. With this configuration, power supplied from the signal input terminal can be transmitted to the base bias voltage supply terminal. Thus, a reduction in the base voltage is suppressed, and the linearity is improved.

In the configuration disclosed in Japanese Unexamined Patent Application Publication No. 2003-324325, the capacitance element connected between the signal input terminal and the base bias voltage supply terminal may be part of a matching circuit seen from the signal input terminal. That is, the capacitance element affects matching between the input impedance of an amplifier and the output impedance of a circuit preceding the amplifier.

BRIEF SUMMARY

Accordingly, the present disclosure provides a power amplifier circuit that matches impedances of an amplifier and the preceding circuit, with improved linearity of power gain.

According to embodiments of the present disclosure, a power amplifier circuit includes an amplifier transistor having a base or gate to which an input signal is supplied, and a collector or drain from which an amplified signal obtained by amplifying the input signal is output, a bias circuit that supplies a bias current or bias voltage to the base or gate of the amplifier transistor, and a resistance element connected in series between the base or gate of the amplifier transistor and the bias circuit. The bias circuit includes a voltage generation circuit that generates a first direct-current voltage in accordance with a control signal, a first transistor having a base or gate to which the first direct-current voltage is supplied, and an emitter or source from which the bias current or bias voltage is supplied to the base or gate of the amplifier transistor via the resistance element, a second transistor having a base or gate to which a second direct-current voltage is supplied, and an emitter or source connected to the emitter or source of the first transistor, a signal supply circuit disposed between the base or gate of the amplifier transistor and the base or gate of the second transistor and configured to supply the input signal to the base or gate of the second transistor, and an impedance circuit disposed between the base or gate of the first transistor and the base or gate of the second transistor. When the power amplifier circuit operates in a first mode, the voltage generation circuit is controlled by the control signal so that the voltage generation circuit is kept in an on state. When the power amplifier circuit operates in a second mode in which a power level of the amplified signal is lower than a power level of the amplified signal in the first mode, the voltage generation circuit is controlled by the control signal so that the voltage generation circuit is kept in an off state.

According to embodiments of the present disclosure, it may be possible to provide a power amplifier circuit that matches impedances of an amplifier and the preceding circuit, with improved linearity of power gain.

Other features, elements, characteristics and advantages of the present disclosure will become more apparent from the following detailed description of embodiments of the present disclosure with reference to the attached drawings.

DETAILED DESCRIPTION

The following describes embodiments of the present disclosure with reference to the drawings. The same or substantially the same elements are denoted by the same numerals, and will not be repeatedly described.

Figure 1:
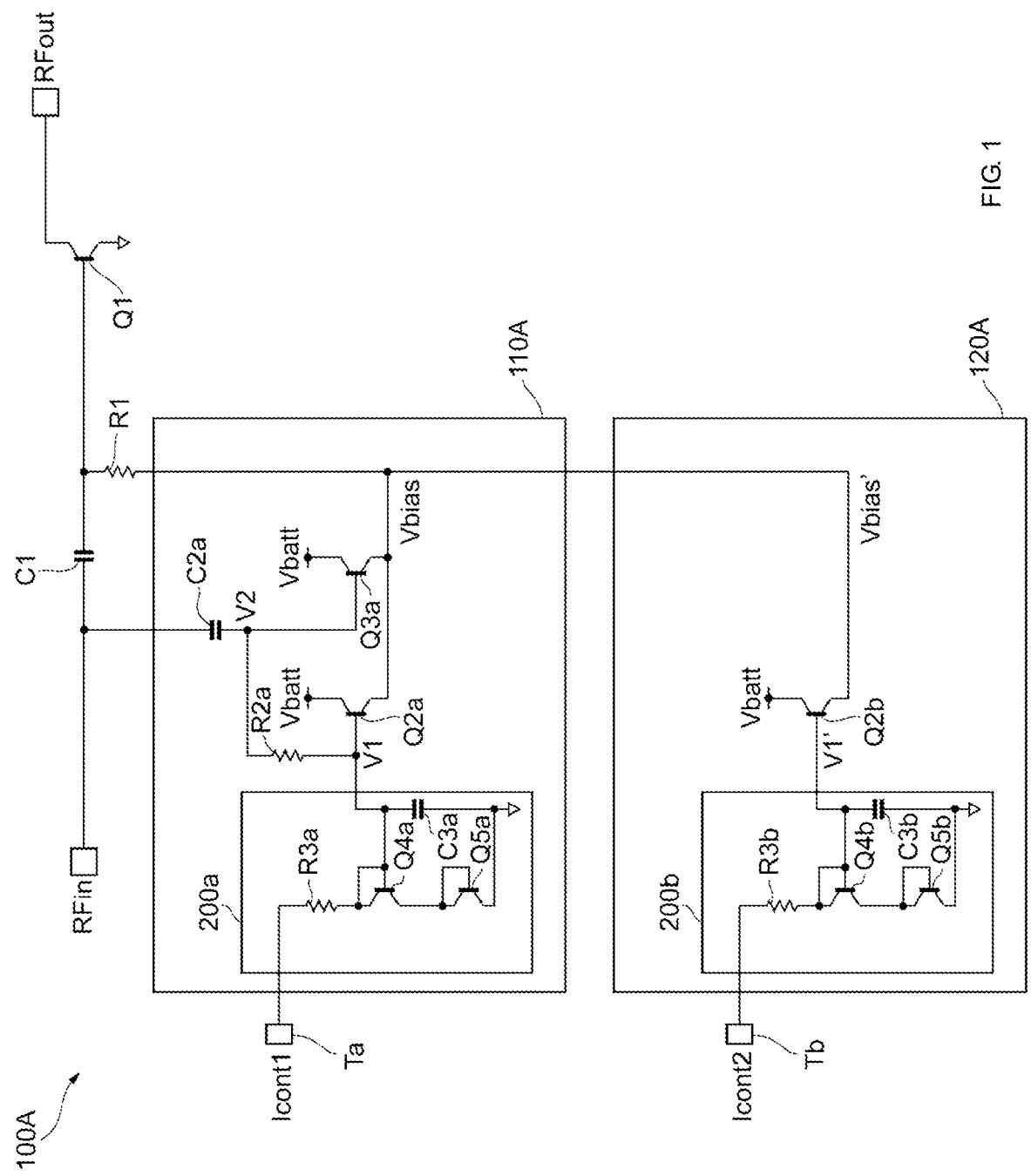
FIG. 1 is a diagram illustrating an example configuration of a power amplifier circuit according to a first embodiment of the present disclosure.

FIG. 1 is a diagram illustrating an example configuration of a power amplifier circuit 100A according to a first embodiment of the present disclosure. The power amplifier circuit 100A illustrated in FIG. 1 is mounted in a mobile phone, for example, and is used to amplify the power of a radio-frequency (RF) signal to be transmitted to a base station. The power amplifier circuit 100A amplifies the power of signals complying with communication standards such as the second generation mobile communication system (2G), the third generation mobile communication system (3G), the fourth generation mobile communication system (4G), the fifth generation mobile communication system (5G), Long Term Evolution Frequency Division Duplex (LTE-FDD), LTE Time Division Duplex (LTE-TDD), LTE-Advanced, and LTE-Advanced Pro. The power amplifier circuit 100A may amplify the power of signals complying with other communication standards.

The power amplifier circuit 100A includes a transistor Q1, bias circuits 110A and 120A, a capacitor C1, and a resistance element R1. The power amplifier circuit 100A amplifies an input signal RFin supplied to an input terminal and outputs an amplified signal RFout from an output terminal. These components will be described in detail hereinafter.

The transistor Q1 (amplifier transistor) has a collector to which a power supply voltage (not illustrated) is supplied, a base connected in series with the capacitor C1, and an emitter grounded. The input signal RFin is supplied to the base of the transistor Q1 from outside the power amplifier circuit 100A via the capacitor C1, and a bias current or bias voltage is further supplied to the base of the transistor Q1 from the bias circuit 110A or the bias circuit 120A via the resistance element R1. Accordingly, the amplified signal RFout, which is obtained by amplifying the input signal RFin, is output from the collector of the transistor Q1. The gain of the transistor Q1 is controlled in accordance with the bias current or bias voltage supplied from the bias circuit 110A or 120A.

The transistor Q1 may be a transistor group including a configuration in which a plurality of unit transistors (fingers) are connected in parallel (i.e., a multi-finger configuration). The term "unit transistor" refers to a minimum element that functions as a transistor.

The transistor Q1 will be described herein as, but not limited to, a bipolar transistor such as a heterojunction bipolar transistor (HBT). A field effect transistor (FET) may be used instead of a bipolar transistor. Examples of the FET include a metal-oxide-semiconductor field effect transistor (MOSFET), a junction field effect transistor (JFET), and a metal-semiconductor field effect transistor (MESFET). When an FET is used instead of a bipolar transistor, the terms "collector", "base", and "emitter" are changed to the terms "drain", "gate", and "source", respectively. The same applies to other transistors described below.

Each of the bias circuits 110A and 120A generates a bias current or bias voltage and supplies the bias current or bias voltage to the base of the transistor Q1. The configuration of the bias circuits 110A and 120A will be described in detail below.

One end of the capacitor C1 is connected to the input terminal. The other end of the capacitor C1 is connected to the base of the transistor Q1. The capacitor C1 removes the direct-current (DC) component of the input signal RFin.

The resistance element R1 is connected in series between the base of the transistor Q1 and the output of the bias circuits 110A and 120A. Specifically, one end of the resistance element R1 is connected to the base of the transistor Q1. The other end of the resistance element R1 is connected to emitters of transistors Q2a, Q3a, and Q2b described below. The resistance element R1 is a ballast resistor for preventing a thermal positive feedback of the transistor Q1. That is, the transistor Q1 has a thermal positive feedback characteristic in which if the temperature of the transistor element increases, the collector current increases, which further raises the temperature of the transistor element, leading to a further increase in the collector current. Thus, for example, if the resistance element R1 is not included in a multi-finger configuration in which a plurality of unit transistors are connected in parallel, the flow of the collector current concentrates on some transistors, which may produce thermal runaway. As a result, the transistors may be broken. In the power amplifier circuit 100A, which includes the resistance element R1, if the base current of the transistor Q1 increases, a voltage drop occurs across the resistance element R1, which suppresses the increase in the base current. Accordingly, an increase in the collector current of the transistor Q1 is suppressed.

Next, the configuration of the bias circuits 110A and 120A will be described in detail. The bias circuit 110A includes, for example, a voltage generation circuit 200a, the transistors Q2a and Q3a, a capacitor C2a, and a resistance element R2a.

The voltage generation circuit 200a includes, for example, a resistance element R3a, transistors Q4a and Q5a, and a capacitor C3a. The resistance element R3a has an end to which a control current Icont1 is supplied from a terminal Ta, and another end connected to the collector of the transistor Q4a. The transistors Q4a and Q5a are connected in series. Specifically, the collector and base of the transistor Q4a are connected (hereinafter also referred to as diode-connected). The collector of the transistor Q4a is connected to the other end of the resistance element R3a, and the emitter of the transistor Q4a is connected to the collector of the transistor Q5a. The transistor Q5a is diode-connected, and the emitter of the transistor Q5a is grounded. One end of the capacitor C3a is connected to the base of the transistor Q4a, and the other end of the capacitor C3a is grounded. The capacitor C3a is used to alternating current (AC) ground the base of the transistor Q2a.

In the voltage generation circuit 200a, with the configuration described above, a voltage V1 (first direct-current voltage) having a predetermined level (e.g., about 2.8 V) is generated at the collector of the transistor Q4a. Each of the transistors Q4a and Q5a may be replaced with a diode element.

The transistor Q2a (first transistor) has a collector to which a power supply voltage Vbatt is supplied, a base to which the voltage V1 is supplied, and an emitter connected to the other end of the resistance element R1. The transistor Q2a supplies a bias current or bias voltage to the base of the transistor Q1 via the resistance element R1. The emitter voltage of the transistor Q2a is represented as a voltage Vbias.

One end of the resistance element R2a is connected to the base of the transistor Q2a, and the other end of the resistance element R2a is connected to the base of the transistor Q3a. The resistance element R2a outputs, from the other end thereof, a voltage V2 (second direct-current voltage) responsive to the voltage V1 supplied to the one end thereof, and supplies the voltage V2 to the base of the transistor Q3a as a bias voltage. The voltage V2 is, for example, a voltage lower than the voltage V1. The bias voltage of the transistor Q3a can be adjusted by adjusting the resistance value of the resistance element R2a. The resistance element R2a is a specific example of an impedance circuit.

The capacitor C2a (signal supply circuit) is connected in series between the base of the transistor Q1 and the base of the transistor Q3a. Specifically, one end of the capacitor C2a is connected to a node between the input terminal and the one end of the capacitor C1, and the other end of the capacitor C2a is connected to the base of the transistor Q3a and the other end of the resistance element R2a. The capacitor C2a removes the DC component of the input signal RFin, detects the AC component of the input signal RFin, and supplies the AC component of the input signal RFin to the base of the transistor Q3a. The capacitor C2a is a specific example of a signal supply circuit. The one end of the capacitor C2a may be connected to a node between the other end of the capacitor C1 and the one end of the resistance element R1.

The transistor Q3a (second transistor) has a collector to which the power supply voltage Vbatt is supplied, a base to which the voltage V2 (second direct-current voltage) responsive to the voltage V1 is supplied, and an emitter connected to the emitter of the transistor Q2a. The AC component of the input signal RFin is further supplied to the base of the transistor Q3a via the capacitor C2a. Accordingly, the transistor Q3a is biased by the voltage V2 and outputs a signal obtained by amplifying the input signal RFin to the emitter of the transistor Q2a. By adjusting the bias voltage to be supplied to the transistor Q3a, the transistor Q3a can be biased such that, for example, the transistor Q3a is turned off when the power level of the input signal RFin is comparatively low and is turned on when the power level of the input signal RFin is comparatively high.

The bias circuit 120A (second bias circuit) includes, for example, a voltage generation circuit 200b (second voltage generation circuit) and the transistor Q2b (third transistor). The voltage generation circuit 200b includes, for example, a resistance element R3b, transistors Q4b and Q5b, and a capacitor C3b. The configuration and operation of the voltage generation circuit 200b and the transistor Q2b are similar to those of the voltage generation circuit 200a and the transistor Q2a in the bias circuit 110A, and thus will not be described in detail. In the bias circuit 120A, the transistor Q2b supplies a bias current or bias voltage to the base of the transistor Q1 via the resistance element R1.

The on and off states of the bias circuits 110A and 120A are respectively controlled by the control currents Icont1 and Icont2, which are supplied to the terminals Ta and Tb, respectively. The control currents Icont1 and Icont2 are specific examples of a control signal. The on and off states of the bias circuits 110A and 120A may be controlled by a control voltage.

The power amplifier circuit 100A operates in two power modes that differ depending on the level of the output power, and the bias circuit to be used is switched in accordance with the power mode in which the power amplifier circuit 100A operates. Specifically, when the power amplifier circuit 100A operates in a high power mode (first mode) in which the output power is greater than or equal to a predetermined level, the control current Icont1 for turning on the voltage generation circuit 200a is supplied to the terminal Ta, and the control current Icont2 for turning off the voltage generation circuit 200b is supplied to the terminal Tb. Accordingly, a bias current or bias voltage is supplied from the bias circuit 110A to the base of the transistor Q1. When the power amplifier circuit 100A operates in a low power mode (second mode) in which the output power is less than the predetermined level, in contrast, the control current Icont1 for turning off the voltage generation circuit 200a is supplied to the terminal Ta, and the control current Icont2 for turning on the voltage generation circuit 200b is supplied to the terminal Tb. Accordingly, a bias current or bias voltage is supplied from the bias circuit 120A to the base of the transistor Q1.

Next, the difference between the bias circuit 110A and the bias circuit 120A will be described with reference to FIGS. 2A to 2C and 3A to 3C. The emitter voltage of the transistor Q2b when the bias circuit 120A is used is denoted by Vbias' (second bias voltage), and the base voltage of the transistor Q2b when the bias circuit 120A is used is denoted by V1' (third direct-current voltage).

Figure 2A:
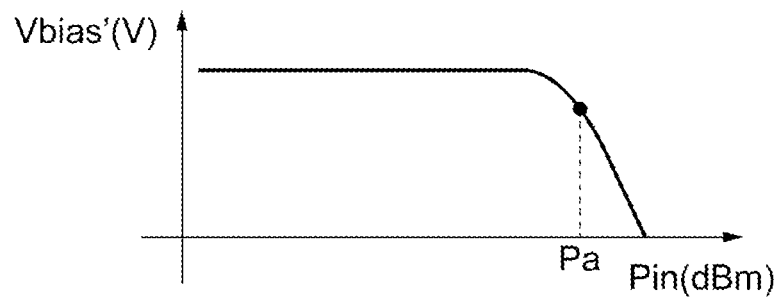
FIG. 2A is a graph depicting a relationship between input power and voltage when a bias circuit is used.
Figure 2B:
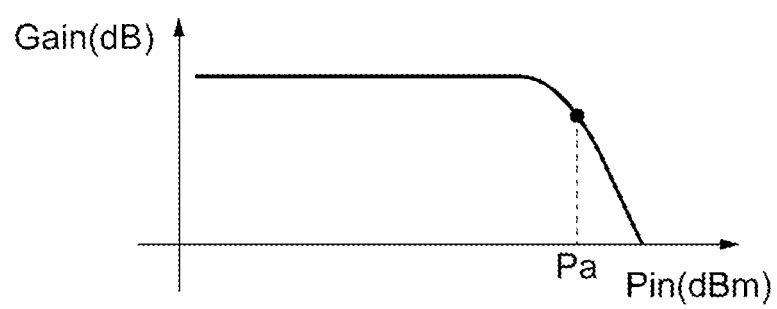
FIG. 2B is a graph depicting a gain characteristic when the bias circuit is used.
Figure 2C:
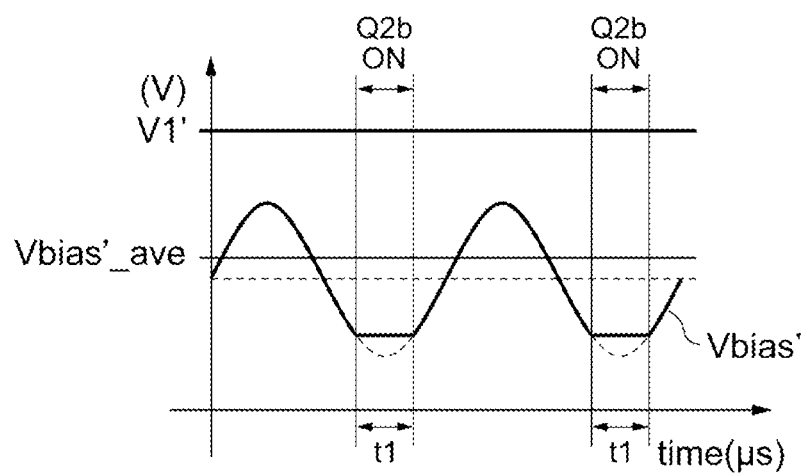
FIG. 2C is a graph depicting a change in voltage with time at an input power when the bias circuit is used.
Figure 3A:
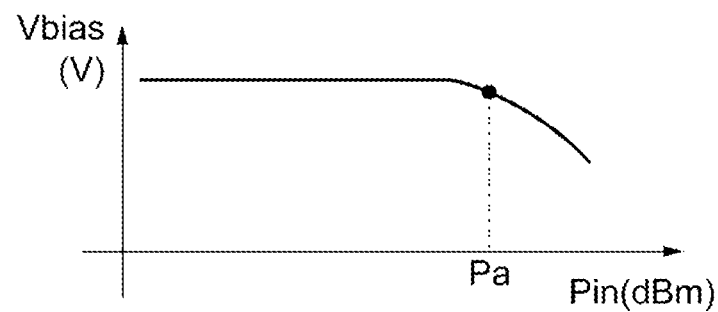
FIG. 3A is a graph depicting a relationship between input power and voltage when another bias circuit is used.
Figure 3B:
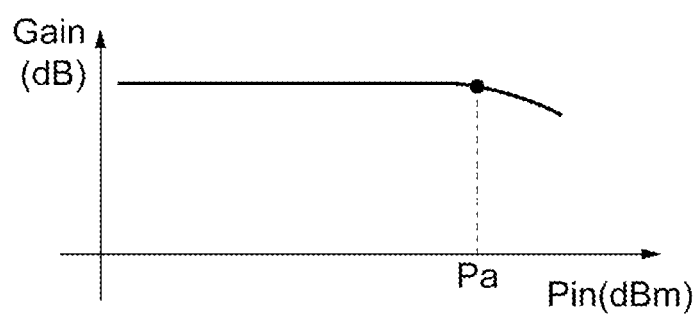
FIG. 3B is a graph depicting a gain characteristic when the other bias circuit is used.
Figure 3C:
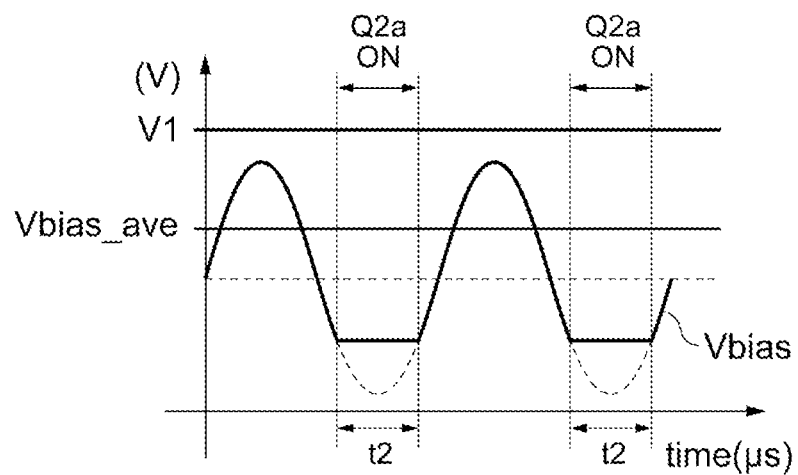
FIG. 3C is a graph depicting a change in voltage with time at an input power when the other bias circuit is used.

FIG. 2A is a graph depicting a relationship between input power Pin and the voltage Vbias' when the bias circuit 120A is used, FIG. 2B is a graph depicting a gain characteristic when the bias circuit 120A is used, and FIG. 2C is a graph depicting a change in the voltage Vbias' with time at an input power Pa when the bias circuit 120A is used. FIG. 3A is a graph depicting a relationship between the input power Pin and the voltage Vbias when the bias circuit 110A is used, FIG. 3B is a graph depicting a gain characteristic when the bias circuit 110A is used, and FIG. 3C is a graph depicting a change in the voltage Vbias with time at the input power Pa when the bias circuit 110A is used.

As illustrated in FIG. 2A, the voltage Vbias' in the bias circuit 120A remains constant within a region where the input power Pin is comparatively low, and rapidly decreases when the input power Pin exceeds a predetermined level. Such a rapid decrease in the voltage Vbias' is caused by the following reason. In accordance with an increase in the base current of the transistor Q1, a voltage drop occurs across the resistance element R1, which causes a decrease in the base voltage of the transistor Q1. Thus, the amplitude of the collector current is not proportionate to the amplitude of the base current, and, as illustrated in FIG. 2B, a decrease in power gain (hereinafter also referred to as gain compression) may occur.

FIG. 2C illustrates the waveform of the voltage Vbias' when the input power Pin has a comparatively high level (the input power Pa illustrated in FIG. 2B). Since the input signal RFin is propagated to the emitter of the transistor Q2b via the resistance element R1, the voltage Vbias' has a waveform that changes in amplitude. When the emitter voltage of the transistor Q2b decreases in accordance with the signal amplitude of the input signal RFin, the transistor Q2b is brought into an on state. During a period in which the transistor Q2b remains in the on state (time t1), the waveform of the voltage Vbias' is kept at a predetermined value. Specifically, the voltage Vbias' is kept at a value obtained by subtracting the base-emitter voltage (Vbe2) of the transistor Q2b from the base voltage (V1') of the transistor Q2b (i.e., at a value given by V1'−Vbe2).

In the bias circuit 110A, in contrast, the input signal RFin, which is detected by the capacitor C2a, is supplied to the base of the transistor Q3a, and the transistor Q3a amplifies the input signal RFin and outputs the amplified signal to the emitter of the transistor Q2a. Accordingly, particularly when the power level of the input signal RFin is comparatively high, the voltage amplitude on the emitter of the transistor Q2a is greater than that in the bias circuit 120A (see FIGS. 2C and 3C). In the bias circuit 110A, therefore, a time period t2 during which the transistor Q2a remains in the on state (i.e., a time period during which the voltage Vbias is kept at a predetermined value (V1−Vbe2)) is longer than that in the bias circuit 120A (i.e., t1<t2). Accordingly, the average value Vbias_ave of the voltage Vbias is larger than the average value Vbias'_ave of the voltage Vbias'. Thus, as illustrated in FIG. 3A, during the use of the bias circuit 110A, the decrease in the voltage Vbias and the decrease in the base voltage of the transistor Q1 are suppressed in a region where the power level of the input power Pin is comparatively high.

As described above, the power amplifier circuit 100A includes the two bias circuits 110A and 120A having different characteristics. The bias circuit 120A is used in the low power mode, and the bias circuit 110A is used in the high power mode. This configuration can improve linearity within a region where the output power is comparatively high, compared to a configuration in which, for example, the bias circuit 120A is used regardless of the level of the output power. In addition, if the bias circuit 110A is used regardless of the output power, an increase in the emitter voltage of the transistors Q2a and Q3a increases the base current of the transistor Q1, which may lead to an unintended increase in power gain. In the power amplifier circuit 100A according to this embodiment, the bias circuit 120A, which does not have an input signal detection function, is used in the low power mode. This may suppress an increase in the power gain. Thus, the linearity of the power gain can be improved in the low power mode.

Referring back to FIG. 1, a description will be given of the impedance on the bias circuit 110A side seen from the input terminal. For example, as disclosed in Japanese Unexamined Patent Application Publication No. 2003-324325, in a configuration that does not include the transistor Q3a or the resistance element R2a, an impedance mismatch occurs between the input terminal and the transistor Q1 due to the influence of the capacitor C2a, which may lead to a reduction in power-added efficiency or a decrease in power gain. For example, in a power amplifier circuit including two stages of amplifiers such that the amplifier in the last stage is constituted by the transistor Q1, an impedance mismatch between the stages may occur. In the power amplifier circuit 100A, in contrast, the base of the transistor Q3a and the resistance element R2a are connected to the end of the capacitor C2a that is farther from the input terminal. The base of a transistor typically has a comparatively high impedance. In the power amplifier circuit 100A, accordingly, the impedance on the capacitor C2a side relative to the impedance on the capacitor C1 side seen from the input terminal is higher than that in the configuration disclosed in Japanese Unexamined Patent Application Publication No. 2003-324325. This can prevent or reduce the effect of the capacitor C2a on impedance matching between an amplifier and a circuit preceding the amplifier. In other words, the power amplifier circuit 100A can match impedances of an amplifier and the preceding circuit, with improved linearity of power gain.

Figure 4:
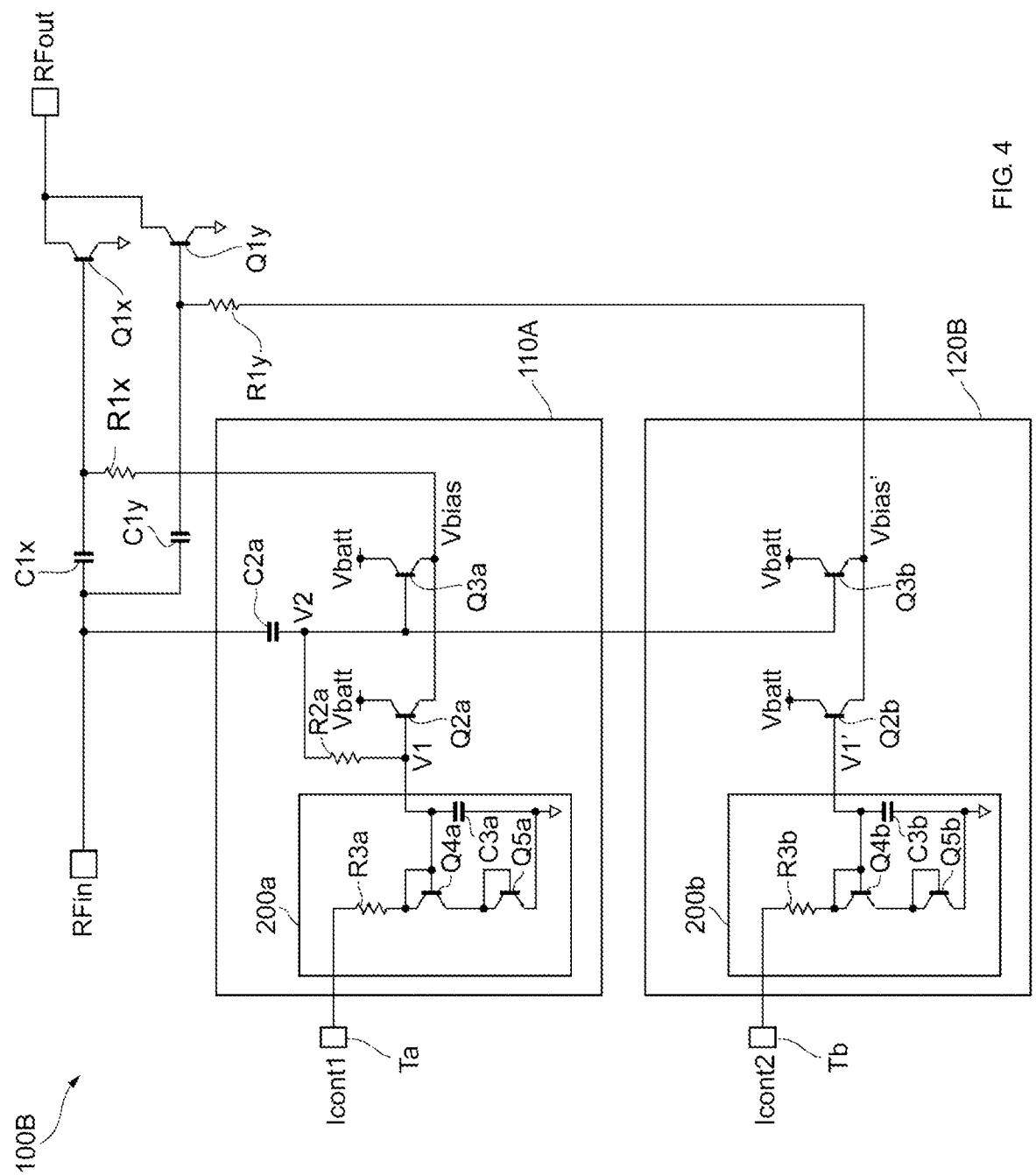
FIG. 4 is a diagram illustrating an example configuration of a power amplifier circuit according to a second embodiment of the present disclosure.

FIG. 4 is a diagram illustrating an example configuration of a power amplifier circuit 100B according to a second embodiment of the present disclosure. The same or substantially the same elements as those of the power amplifier circuit 100A are denoted by the same numerals and will not be described. In the second and subsequent embodiments, features common to the first embodiment will not be described, and only the differences will be described. In particular, similar operations and effects achieved with similar configurations will not be described again in the individual embodiments.

As illustrated in FIG. 4, in the power amplifier circuit 100B, amplifier paths, each including the transistor Q1, the capacitor C1, and the resistance element R1 of the power amplifier circuit 100A, are connected in parallel. The power amplifier circuit 100B further includes a bias circuit 120B instead of the bias circuit 120A.

One of the two amplifier paths connected in parallel includes a transistor Q1x, a capacitor C1x, and a resistance element R1x, and the other amplifier path includes a transistor Q1y (second amplifier transistor), a capacitor C1y, and a resistance element R1y (second resistance element). The connection relationships and the operations of these elements are similar to those of the transistor Q1, the capacitor C1, and the resistance element R1 in the power amplifier circuit 100A, and thus will not be described in detail. A bias current or bias voltage is supplied to the base of the transistor Q1x from the bias circuit 110A via the resistance element R1x, and a bias current or bias voltage is supplied to the base of the transistor Q1y from the bias circuit 120B via the resistance element R1y.

Unlike the bias circuit 120A, the bias circuit 120B further includes a transistor Q3b (fourth transistor). Similarly to the transistor Q3a in the bias circuit 110A, the transistor Q3b has a collector to which the power supply voltage Vbatt is supplied, a base to which the voltage V2 responsive to the voltage V1 is supplied, and an emitter connected to the emitter of the transistor Q2b. The AC component of the input signal RFin is further supplied to the base of the transistor Q3b via the capacitor C2a. Accordingly, the transistor Q3b is biased by the voltage V2, and outputs a signal obtained by amplifying the input signal RFin to the emitter of the transistor Q2b.

In this embodiment, when the power amplifier circuit 100B operates in the high power mode, the control currents Icont1 and Icont2 for respectively turning on the voltage generation circuits 200a and 200b are supplied to the terminals Ta and Tb, respectively. Accordingly, a bias current is supplied from the bias circuit 110A to the transistor Q1x, and a bias current is supplied from the bias circuit 120B to the transistor Q1y, thereby allowing both transistors to operate. At this time, the input signal RFin, which is detected by the capacitor C2a, is also supplied to the transistor Q3b in addition to the transistor Q3a. Accordingly, like the bias circuit 110A, the bias circuit 120B operates as a circuit having an input signal detection function. When the power amplifier circuit 100B operates in the low power mode, in contrast, the control current Icont1 for turning off the voltage generation circuit 200a is supplied to the terminal Ta, and the control current Icont2 for turning on the voltage generation circuit 200b is supplied to the terminal Tb. Accordingly, a bias current is supplied from the bias circuit 120B, to the transistor Q1y and the transistor Q1y operates. At this time, the voltage generation circuit 200a is in an off state. Thus, no DC voltage is supplied to the base of the transistor Q3b, and the transistor Q3b is brought into an off state.

Accordingly, like the bias circuit 120A, the bias circuit 120B operates as a circuit having no input signal detection function.

With the configuration described above, like the power amplifier circuit 100A, the power amplifier circuit 100B can also match impedances of an amplifier and the preceding circuit, with improved linearity of power gain. In the power amplifier circuit 100B, furthermore, the transistor size for amplification is switched in accordance with the power mode. The transistors Q1x and Q1y can thus be designed in accordance with each power mode.

Figure 5:
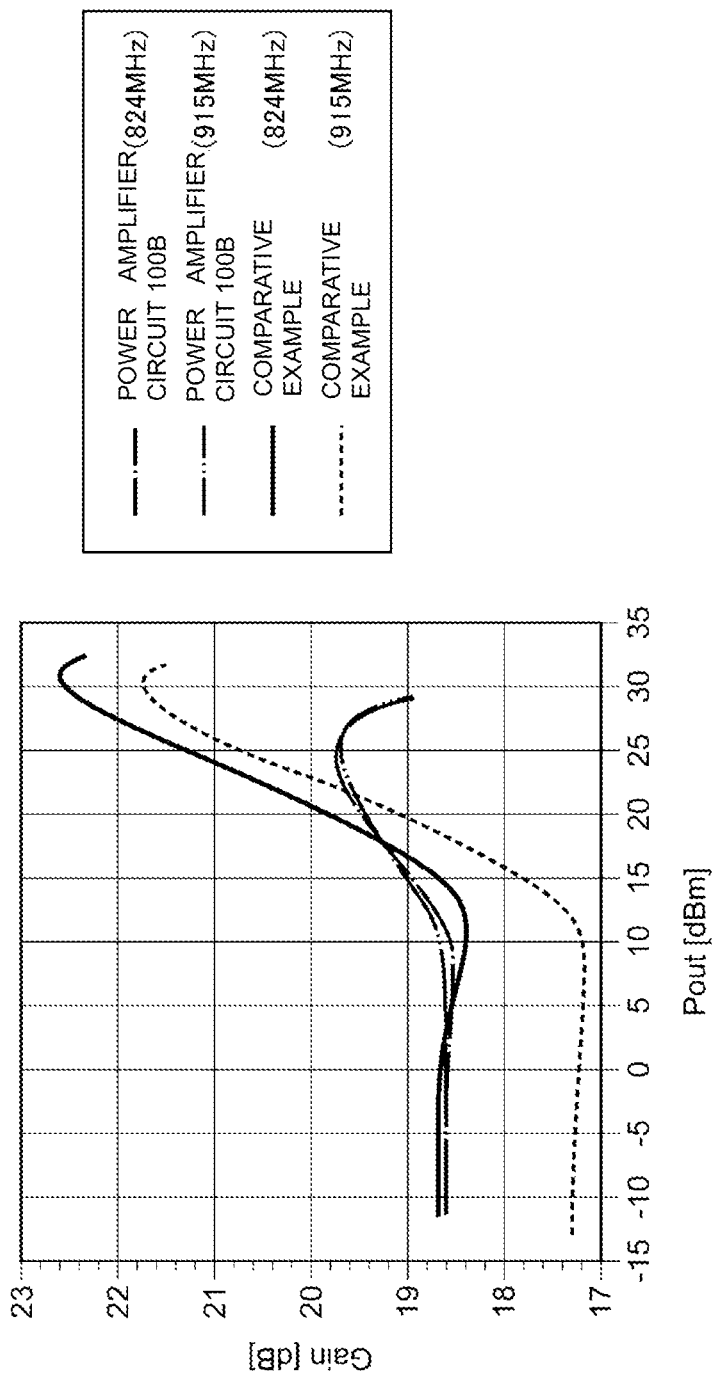
FIG. 5 is a graph depicting simulation results of the power gain of the power amplifier circuit according to the second embodiment of the present disclosure and simulation results of power gain in a comparative example.

FIG. 5 is a graph depicting simulation results of the power gain of the power amplifier circuit 100B according to the second embodiment of the present disclosure and simulation results of power gain in a comparative example. Specifically, the graph illustrated in FIG. 5 depicts results of simulation of the relationship between output power and power gain when the frequency of the input signal RFin is set to 824 MHz or 915 MHz. In the comparative example, a configuration similar to the configuration of the power amplifier circuit 100B is used, and results are obtained when the bias circuit 110A is turned on (i.e., the detection function is enabled) in both the high power mode and the low power mode. In FIG. 5, the horizontal axis represents output power Pout (dBm) and the vertical axis represents gain (dB).

As illustrated in FIG. 5, in the comparative example, the power gain largely increases with an increase in output power regardless of the frequency. In the power amplifier circuit 100B, in contrast, the power gain slightly increases with an increase in output power, with the amount of the increase being smaller than that in the comparative example. This indicates that the linearity of the power gain of the power amplifier circuit 100B is improved, compared to the comparative example.

Figure 6:
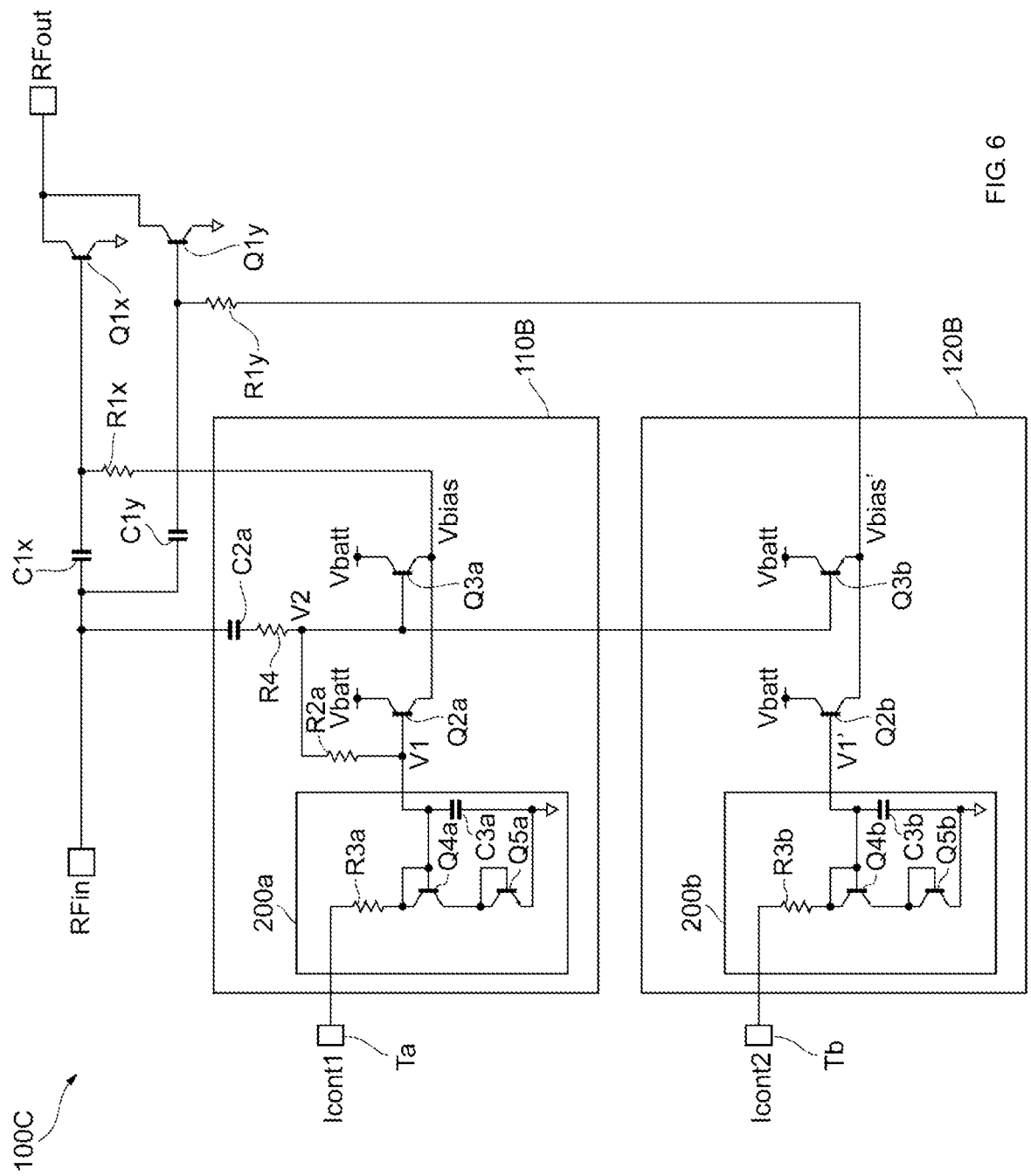
FIG. 6 is a diagram illustrating an example configuration of a power amplifier circuit according to a third embodiment of the present disclosure.

FIG. 6 is a diagram illustrating an example configuration of a power amplifier circuit 100C according to a third embodiment of the present disclosure. The same or substantially the same elements as those of the power amplifier circuit 100B are denoted by the same numerals and will not be described.

As illustrated in FIG. 6, unlike the power amplifier circuit 100B, the power amplifier circuit 100C includes a bias circuit 110B instead of the bias circuit 110A. Specifically, unlike the bias circuit 110A, the bias circuit 110B further includes a resistance element R4.

The resistance element R4 is connected in series with the capacitor C2a. By adjusting the resistance value of the resistance element R4, the level at which the capacitor C2a detects the input signal RFin can be adjusted.

With this configuration, like the power amplifier circuit 100B, the power amplifier circuit 100C can also match impedances of an amplifier and the preceding circuit, with improved linearity of power gain.

Figure 7:
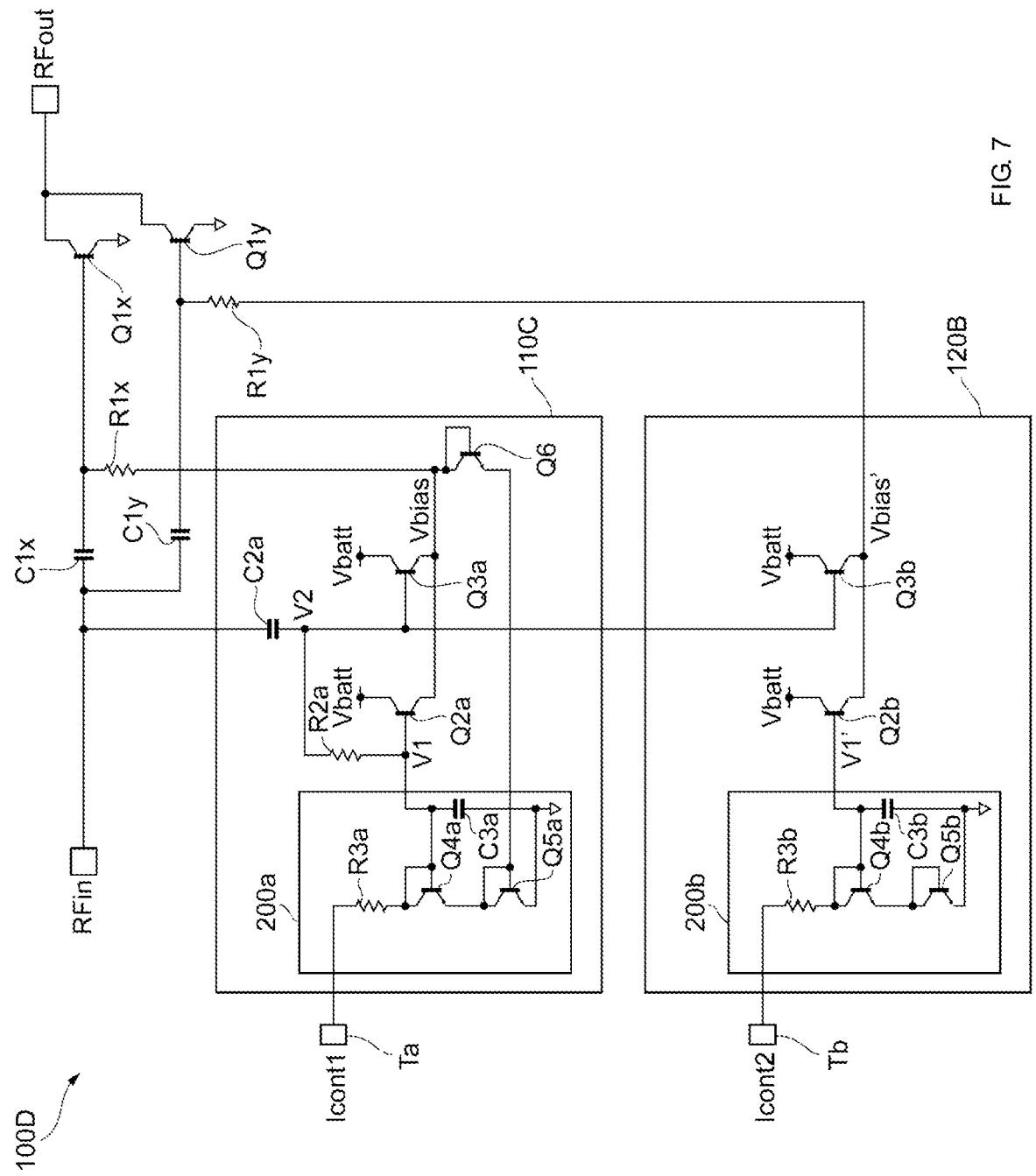
FIG. 7 is a diagram illustrating an example configuration of a power amplifier circuit according to a fourth embodiment of the present disclosure.

FIG. 7 is a diagram illustrating an example configuration of a power amplifier circuit 100D according to a fourth embodiment of the present disclosure. The same or substantially the same elements as those of the power amplifier circuit 100B are denoted by the same numerals and will not be described.

As illustrated in FIG. 7, unlike the power amplifier circuit 100B, the power amplifier circuit 100D includes a bias circuit 110C instead of the bias circuit 110A. Specifically, unlike the bias circuit 110A, the bias circuit 110C further includes a transistor Q6.

The transistor Q6 is diode-connected. The transistor Q6 has a collector connected to the emitters of the transistors Q2a and Q3a and an emitter connected to the base of the transistor Q5a. That is, the emitter of the transistor Q6 is supplied with the base-emitter voltage Vbe5 of the transistor Q5a. The functions of the transistor Q6 will be described with reference to FIGS. 8A and 8B.

Figure 8A:
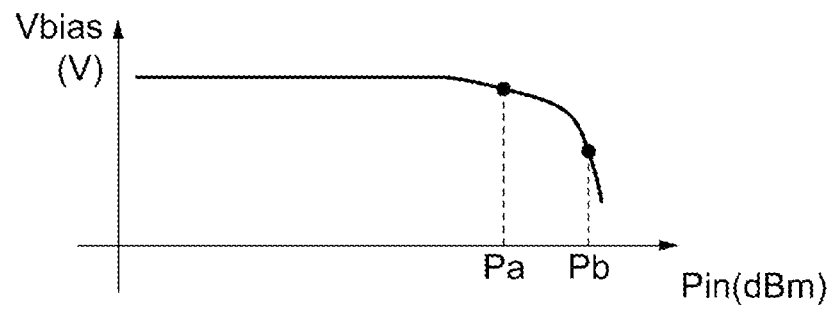
FIG. 8A is a graph depicting a relationship between input power and voltage in the power amplifier circuit according to the fourth embodiment of the present disclosure.
Figure 8B:
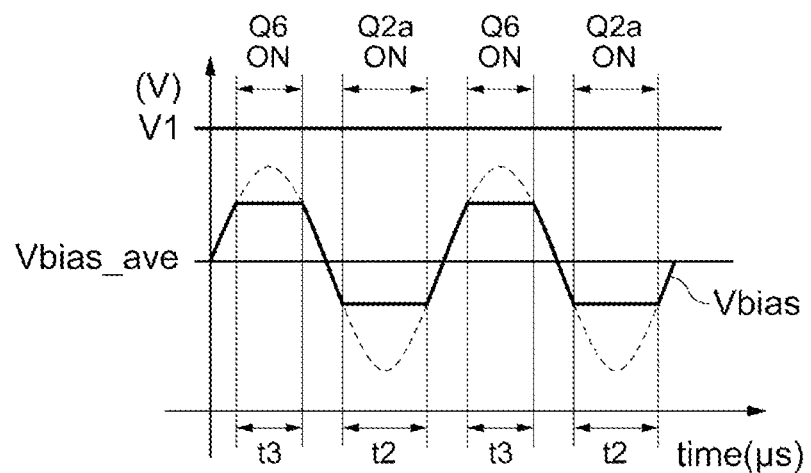
FIG. 8B is a graph depicting a change in voltage with time at an input power in the power amplifier circuit according to the fourth embodiment of the present disclosure.

FIG. 8A is a graph depicting a relationship between the input power Pin and the voltage Vbias in the power amplifier circuit 100D according to the fourth embodiment of the present disclosure, and FIG. 8B is a graph depicting a change in the voltage Vbias with time at an input power Pb in the power amplifier circuit 100D according to the fourth embodiment of the present disclosure. The input power Pb is an input power at which the input signal RFin has a comparatively high power level and at which, for example, the transistor Q1 operates in saturation mode.

As illustrated in FIG. 8B, in the power amplifier circuit 100D, the on and off states of the transistor Q6, in addition to the on and off states of the transistor Q2a, are switched. That is, when the collector voltage of the transistor Q6 increases in accordance with the signal amplitude of the input signal RFin, the transistor Q6 is brought into an on state. During a period in which the transistor Q6 remains in the on state (time t3), the waveform of the voltage Vbias is kept at a predetermined value. Specifically, the voltage Vbias is kept at a value obtained by adding together the base-emitter voltage (Vbe5) of the transistor Q5a and the base-emitter voltage (Vbe6) of the transistor Q6 (i.e., at a value given by Vbe5+Vbe6).

In the power amplifier circuit 100D, as described above, the transistor Q2a is turned on in response to a decrease in the voltage Vbias, and the transistor Q6 is turned on in response to an increase in the voltage Vbias. Accordingly, when the transistor Q1 operates in saturation mode, the average value, Vbias_ave, of the voltage Vbias is smaller than that in a configuration that does not include the transistor Q6 (see FIGS. 8B and 3C). In the power amplifier circuit 100A, as illustrated in FIG. 3A, the voltage Vbias may be increased in saturation mode and the linearity of the power gain may be improved, whereas the power-added efficiency may be lowered. In the power amplifier circuit 100D, in contrast, as illustrated in FIG. 8A, the increase in the voltage Vbias in saturation mode is suppressed, and the power-added efficiency can be improved.

With the configuration described above, like the power amplifier circuit 100B, the power amplifier circuit 100D can also match impedances of an amplifier and the preceding circuit, with improved linearity of power gain. In addition, the power amplifier circuit 100D, which includes the transistor Q6, can improve the power-added efficiency within a region where the power level of the input signal RFin is comparatively high, compared to the power amplifier circuits 100A to 100C.

The transistor Q6 may be replaced with a diode element.

The power amplifier circuit 100D may further include the resistance element R4, as in the power amplifier circuit 100C.

Figure 9:
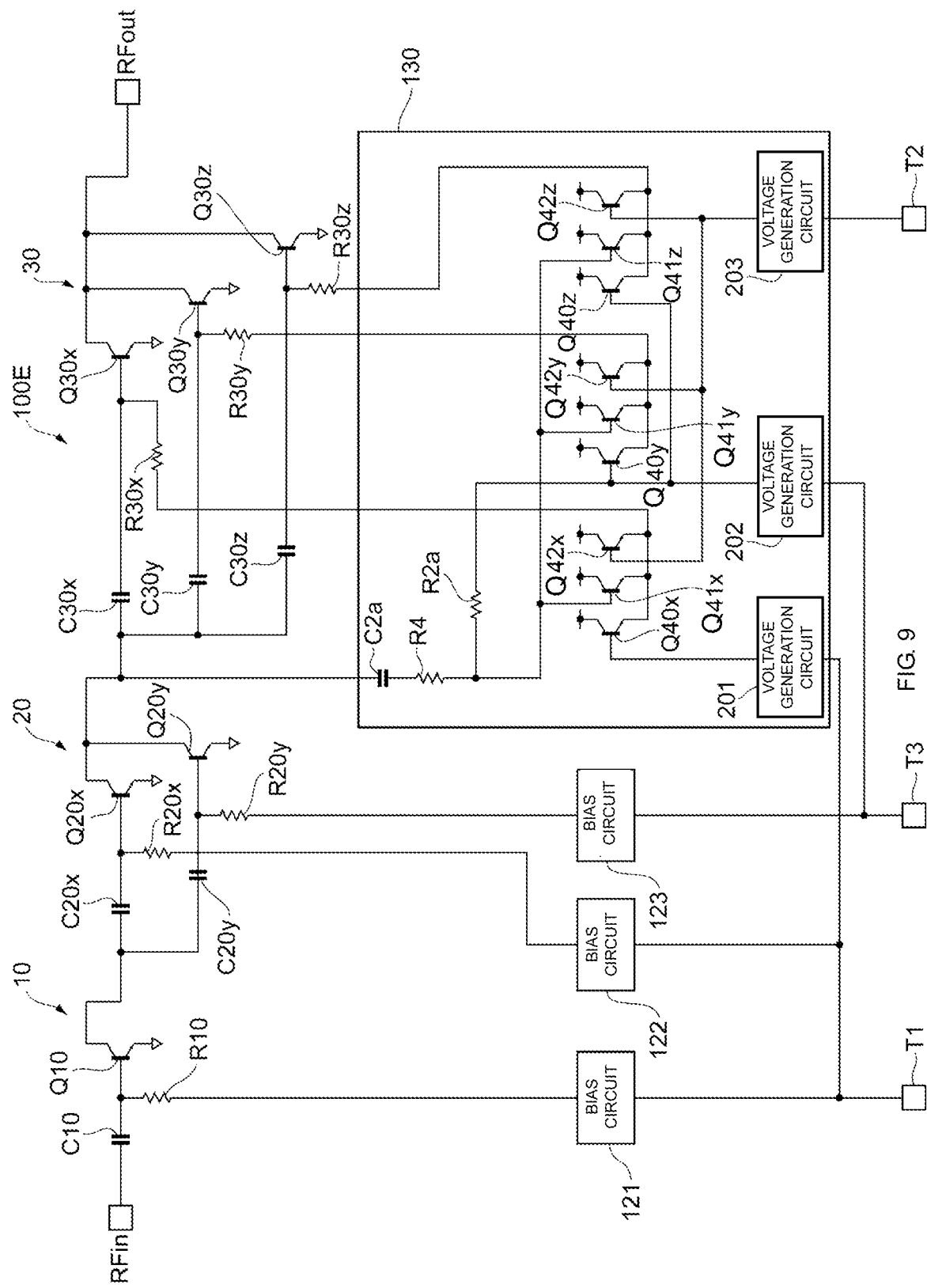
FIG. 9 is a diagram illustrating an example configuration of a power amplifier circuit according to a fifth embodiment of the present disclosure.

FIG. 9 is a diagram illustrating an example configuration of a power amplifier circuit 100E according to a fifth embodiment of the present disclosure. The same or substantially the same elements as those of the power amplifier circuit 100A are denoted by the same numerals and will not be described.

As illustrated in FIG. 9, in the power amplifier circuit 100E, amplifiers are connected in multiple stages. Specifically, the power amplifier circuit 100E includes three stages of amplifiers 10, 20, and 30.

The amplifier 10 in the first stage includes a single amplifier path. The amplifier path is constituted by a transistor Q10, a capacitor C10, and a resistance element R10. The amplifier 20 in the second stage includes two amplifier paths. One of the amplifier paths is constituted by a transistor Q20x, a capacitor C20x, and a resistance element R20x. The other amplifier path is constituted by a transistor Q20y, a capacitor C20y, and a resistance element R20y. The amplifier 30 in the third stage includes three amplifier paths. One of the amplifier paths is constituted by a transistor Q30x, a capacitor C30x, and a resistance element R30x. Another amplifier path is constituted by a transistor Q30y, a capacitor C30y, and a resistance element R30y. The other amplifier path is constituted by a transistor Q30z, a capacitor C30z, and a resistance element R30z. The connection relationships and the operations of these elements are similar to those of the transistor Q1, the capacitor C1, and the resistance element R1 in the power amplifier circuit 100A, and thus will not be described in detail.

Bias currents or bias voltages are supplied to the bases of the transistors Q10, Q20x, and Q20y from bias circuits 121 to 123, respectively. Further, bias currents or bias voltages are supplied to the transistors Q30x, Q30y, and Q30z from a bias circuit 130. The configurations of the bias circuits 121 to 123 may be similar to that of the bias circuit 120A illustrated in FIG. 1, and thus will not be described in detail.

The bias circuit 130 includes three voltage generation circuits 201 to 203, nine transistors Q40x, Q40y, Q40z, Q41x, Q41y, Q41z, Q42x, Q42y, and Q42z, the capacitor C2a, and resistance elements R2a and R4. The configurations of the three voltage generation circuits 201 to 203 may be similar to that of the voltage generation circuit 200a illustrated in FIG. 1, and thus will not be described in detail.

The transistors Q40x, Q40y, and Q40z and the transistors Q42x, Q42y, and Q42z are elements, each corresponding to the transistor Q2a in the bias circuit 110A, and are configured to supply bias currents to the transistors Q30x, Q30y, Q30z, respectively. The transistors Q41x, Q41y, and Q41z are elements, each corresponding to the transistor Q3a in the bias circuit 110A, and are supplied with the input signal RFin, which is detected by the capacitor C2a. The transistor Q40x is controlled by an on or off signal supplied to a terminal T1, the transistors Q42x, Q42y, and Q42z are controlled by an on or off signal supplied to a terminal T2, and the transistors Q40y, Q40z, Q41x, Q41y, and Q41z are controlled by an on or off signal supplied to a terminal T3.

The power amplifier circuit 100E operates in three power modes that differ depending on the level of the output power, and the bias current is switched in accordance with the power mode in which the power amplifier circuit 100E operates. Specifically, when the power amplifier circuit 100E operates in the low power mode, an on signal is supplied to the terminal T1 and an off signal is supplied to the terminals T2 and T3. Accordingly, the bias circuit 121, the bias circuit 122, and the voltage generation circuit 201 are brought into an on state. In the low power mode, therefore, the transistors Q10, Q20x, and Q30x perform an amplification operation. When the power amplifier circuit 100E operates in a middle power mode in which the output power is greater than that in the low power mode and is less than that in the high power mode, an on signal is supplied to the terminals T1 and T2 and an off signal is supplied to the terminal T3. Accordingly, the bias circuit 121, the bias circuit 122, the voltage generation circuit 201, and the voltage generation circuit 203 are brought into an on state. In the middle power mode, therefore, the transistors Q10, Q20x, Q30x, Q30y, and Q30z perform an amplification operation. When the power amplifier circuit 100E operates in the high power mode, an on signal is supplied to all the terminals T1 to T3. Accordingly, all of the bias circuits 121 to 123 and the voltage generation circuits 201 to 203 are brought into an on state. In the high power mode, therefore, all of the transistors Q10, Q20x, Q20y, Q30x, Q30y, and Q30z perform an amplification operation. In this case, the transistors Q41x, Q41y, and Q41z are turned on, and accordingly the bias circuit 130 operates as a circuit having a detection function, like the bias circuit 110A.

With the configuration described above, like the power amplifier circuit 100A, the power amplifier circuit 100E can also match the output impedance of the amplifier in the preceding stage and the input impedance of the amplifier in the subsequent stage, with improved linearity of power gain. In the power amplifier circuit 100E, furthermore, the transistor size and the enabling and disabling of the detection function of the bias circuits can be switched in accordance with the three power modes. Thus, the linearity can be further improved, compared to a configuration in which the transistor size and the enabling and disabling of the detection function of the bias circuits are not switched.

As illustrated in FIG. 9, in a configuration in which amplifiers are connected in multiple stages, the configurations of the bias circuits 121 to 123 are not limited, and the bias circuits 121 to 123 may have any of the various bias circuit configurations described above.

Additionally, the number of stages of amplifiers to be connected is not limited to three, and two or four or more stages of amplifiers may be connected.

Exemplary embodiments of the present disclosure have been described. In the power amplifier circuits 100A to 100E, the bias circuits 110A to 110C and 130 include the transistors Q2a, Q40x, Q40y, and Q40z that supply a bias current or bias voltage to the bases of the transistors Q1, Q30x, Q30y, and Q30z; the transistors Q3a, Q41x, Q41y, and Q41z that amplify the input signal RFin supplied from a signal supply circuit (e.g., the capacitor C2a) and that output the amplified signal to the emitters of the transistors Q2a, Q40x, Q40y, and Q40z; and an impedance circuit (e.g., the resistance element R2a) connected between the bases of the transistors Q2a and Q3a or between the bases of the transistors Q40y and Q40z, and Q41x, Q41y, and Q41z. With this configuration, a reduction in the voltage Vbias can be suppressed and, and the linearity of the power gain can be improved. In addition, the impedance on the capacitor C2a side seen from the input terminal is high, which can prevent or reduce the effect of the capacitor C2a on impedance matching between an amplifier and a circuit preceding the amplifier. Accordingly, the power amplifier circuits 100A to 100E can match impedances of an amplifier and the preceding circuit, with improved linearity of power gain, compared to the configuration disclosed in Japanese Unexamined Patent Application Publication No. 2003-324325. Additionally, the on and off states of the transistors Q3a, Q41x, Q41y, and Q41z are switched in accordance with the power mode of the power amplifier circuits 100A to 100E, which can improve the linearity of the power gain in the low power mode or the middle power mode.

The embodiments described above are intended to help easily understand the present disclosure, and are not to be used to construe the present disclosure in a limiting fashion. Various modifications or improvements can be made to the present disclosure without necessarily departing from the gist of the present disclosure, and equivalents thereof are also included in the present disclosure. That is, the embodiments may be appropriately modified in design by those skilled in the art, and such modifications also fall within the scope of the present disclosure so long as the modifications include the features of the present disclosure. For example, the elements included in the embodiments and the arrangement, materials, conditions, shapes, sizes, and the like thereof are not limited to those described in the illustrated examples, but can be modified as appropriate. Furthermore, the elements included in the embodiments can be combined as much as technically possible, and such combinations of elements also fall within the scope of the present disclosure so long as the combinations of elements include the features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
an amplifier transistor having a base or a gate to which an input signal is supplied, and having a collector or a drain from which an amplified signal is output, the amplified signal being obtained by amplifying the input signal;
a bias circuit configured to supply a bias current or a bias voltage to the base or the gate of the amplifier transistor; and
a resistance element connected in series between the base of the amplifier transistor and the bias circuit, or between the gate of the amplifier transistor and the bias circuit, wherein:
the bias circuit comprises:
a first transistor having a base or a gate to which a first direct-current voltage is supplied, and having an emitter or a source from which the bias current or the bias voltage is supplied to the base or the gate of the amplifier transistor via the resistance element;
a second transistor having a base or a gate to which a second direct-current voltage is supplied, and having an emitter or a source connected to the emitter or the source of the first transistor;
a signal supply circuit disposed between the base or the gate of the second transistor and a supply path of the input signal to the amplifier transistor, the signal supply circuit being configured to supply the input signal to the base or the gate of the second transistor; and
an impedance circuit disposed between the base or the gate of the first transistor and the base or the gate of the second transistor.

2. The power amplifier circuit according to claim 1, wherein the impedance circuit comprises a resistance element.

3. The power amplifier circuit according to claim 1, wherein the signal supply circuit comprises a capacitance element.

4. The power amplifier circuit according to claim 1, wherein the signal supply circuit comprises a capacitance element and a resistance element connected in series.

5. The power amplifier circuit according to claim 1, wherein:
the impedance circuit comprises a resistance element having a first end connected to the base or the gate of the first transistor, and having a second end connected to the base or the gate of the second transistor, and
the signal supply circuit comprises a capacitance element having a first end connected to the supply path, and having a second end connected to the second end of the resistance element of the impedance circuit.

6. The power amplifier circuit according to claim 4, further comprising a capacitance element in the supply path connected between the first end of the capacitance element of the signal supply circuit and the base of the amplifier transistor, or between the first end of the capacitance element of the signal supply circuit and the gate of the amplifier transistor.

7. The power amplifier circuit according to claim 1, further comprising:
a second bias circuit configured to supply a second bias current or a second bias voltage to the base or the gate of the amplifier transistor, wherein:
the second bias circuit comprises:
a third transistor having a base or a gate to which a third direct-current voltage is supplied, and having an emitter or a source from which the second bias current or the second bias voltage is supplied to the base or the gate of the amplifier transistor via the resistance element,
when the power amplifier circuit operates in a first mode, the second voltage generation circuit is configured to be kept in an off state by a second control signal, and
when the power amplifier circuit operates in a second mode, the second voltage generation circuit is configured to be kept in an on state by the second control signal.

8. The power amplifier circuit according to claim 7, wherein the second bias circuit further comprises:
a second voltage generation circuit configured to generate the third direct-current voltage in accordance with the second control signal.

9. The power amplifier circuit according to claim 7, wherein the second mode is a mode in which a power level of the amplified signal is less than a power level of the amplified signal in the first mode.

10. The power amplifier circuit according to claim 1, further comprising:
a second amplifier transistor having a base or a gate to which the input signal is supplied, and having a collector or a drain connected to the collector or the drain of the amplifier transistor;
a second bias circuit configured to supply a second bias current or a second bias voltage to the base or the gate of the second amplifier transistor; and
a second resistance element connected in series between the base of the second amplifier transistor and the second bias circuit, or between the gate of the second amplifier transistor and the second bias circuit, wherein:
the second bias circuit comprises:
a third transistor having a base or a gate to which a third direct-current voltage is supplied, and having an emitter or a source from which the second bias current or the second bias voltage is supplied to the base or the gate of the second amplifier transistor via the second resistance element; and
a fourth transistor having a base or a gate connected to the signal supply circuit, and having an emitter or a source connected to the emitter or the source of the third transistor, and
the second voltage generation circuit is configured to be kept in an on state by a second control signal when the power amplifier circuit operates in both a first mode and a second mode.

11. The power amplifier circuit according to claim 10, wherein the second bias circuit further comprises:
  a second voltage generation circuit configured to generate the third direct-current voltage in accordance with the second control signal.

12. The power amplifier circuit according to claim 10, wherein the second mode is a mode in which a power level of the amplified signal is less than a power level of the amplified signal in the first mode.

13. The power amplifier circuit according to claim 1, wherein the amplifier transistor is a bipolar transistor.

14. The power amplifier circuit according to claim 1, wherein the amplifier transistor is a field effect transistor.

15. The power amplifier circuit according to claim 1, wherein the first transistor is a bipolar transistor.

16. The power amplifier circuit according to claim 1, wherein the first transistor is a field effect transistor.

17. The power amplifier circuit according to claim 1, wherein the second transistor is a bipolar transistor.

18. The power amplifier circuit according to claim 1, wherein the second transistor is a field effect transistor.

* * * * *